US005545917A

United States Patent [19]
Peppiette et al.

[11] Patent Number: 5,545,917
[45] Date of Patent: Aug. 13, 1996

[54] SEPARATE PROTECTIVE TRANSISTOR

[75] Inventors: Roger C. Peppiette; Richard B. Cooper, both of Shrewsbury; Robert J. Stoddard, Lincoln, all of Mass.

[73] Assignee: Allegro Microsystems, Inc., Worcester, Mass.

[21] Appl. No.: 245,127

[22] Filed: May 17, 1994

[51] Int. Cl.[6] ............................................. H01L 29/00
[52] U.S. Cl. ........................ 257/547; 257/500; 257/544; 257/552; 327/565
[58] Field of Search ........................... 257/500, 544, 257/546, 552, 547; 327/564, 565

[56] References Cited

U.S. PATENT DOCUMENTS

| | | | |
|---|---|---|---|
| 4,027,325 | 5/1977 | Genesi | 257/547 |
| 4,458,158 | 7/1984 | Mayrand | 326/101 |
| 4,466,011 | 8/1984 | Zanten | 257/547 |
| 4,646,124 | 2/1987 | Zunino | 257/370 |
| 5,021,860 | 6/1991 | Bertotti et al. | 257/552 |

*Primary Examiner*—Jerome Jackson, Jr.
*Assistant Examiner*—John Guay

[57] ABSTRACT

A semiconductor integrated circuit has a P-type substrate and a plurality of PN-junction isolated islands of N-type, a first one of the islands may contain a power device which during certain periods of operation causes the first island to become forward biassed and to inject electrons into the substrate. Collection of these injected charges by a second island at one side of the injecting island is reduced by a separate protective bipolar transistor formed in a third N-type island. The third island is preferably interposed between the injecting island and the islands to be protected, but may be located anywhere with respect to the injecting transistor. The emitter of the protective transistor is electrically connected to an N-type portion of the first island. The collector of the protective transistor is connected to the P-type isolation-wall portion of the substrate located between the injecting transistor and the small islands to be protected. The base of the protective transistor, and the isolation-wall portion of the substrate at the opposite side of the first island, are electrically connected to a circuit ground point in the integrated circuit. This causes preferential injection through that part of the forward biassed PN-junction of the injecting island, which part is farthest from the second island. It also generates a field under the first island, proportional to the magnitude of the injected current, that further diverts and prevents diffusion of the injected charges toward the second island.

10 Claims, 6 Drawing Sheets

SEPARATE PROTECTIVE TRANSISTOR

BACKGROUND

This invention relates to semiconductor integrated circuits having electrical devices formed in PN-junction isolated islands, and more particularly to such integrated circuits wherein a separate protective transistor adjacent to one of the islands substantially prevents injected parasitic current from the one island into the substrate from being collected by others of the islands.

Momentary or repetitive forward biasing of a PN-junction isolated island can occur, for example, when a transistor formed in that island is used to drive an inductive load. And forward biasing of a first integrated circuit island tends to create a parasitic bipolar transistor having an emitter corresponding to the first island, a base corresponding to the substrate, and a collector corresponding to a neighboring second PN-junction isolated island. This can result in multiple unwanted effects, e.g. spurious currents in the second island that can cause malfunction of a device formed in the second island, and increased integrated circuit power dissipation and overheating. The effect on the neighboring islands is especially troublesome when the device of the first island is substantially larger than and carries heavier currents than do small surrounding islands.

Toward ameliorating this problem, the power device in the large island may be designed to inject reduced amounts of carriers into the substrate when the PN-junction isolating that island is forward biased. An example of such a structure is described by Mayrand in U.S. Pat. No. 4,458,158, issued Jul. 3, 1984 and assigned to the same assignee as is the present invention.

Alternatively, the large island that is prone to inject electrons into the substrate may include structures that block and divert such injected carriers away from adjacent small islands which tend to collect the injected carriers. Such a construction is described by Genesi in U.S. Pat. No. 4,027,325, issued May 31, 1977 and assigned to the same assignee as is the present invention.

In that patent, a large power diode is to operate in a full wave bridge rectifier with anode connected to the most negative voltage, in this case ground. The island containing the power diode is of N-type epitaxial material serving as the cathode, and is formed in the P-type substrate serving as the anode. When the diode is forward biased, the electrons injected into the substrate are substantially prevented from being collected by adjacent epitaxial islands by an annular N-type ring that surrounds but is spaced from the diode island. Both the N-type ring and the anode, namely the P-type substrate (and isolation walls), are electrically connected together.

Figure 1:
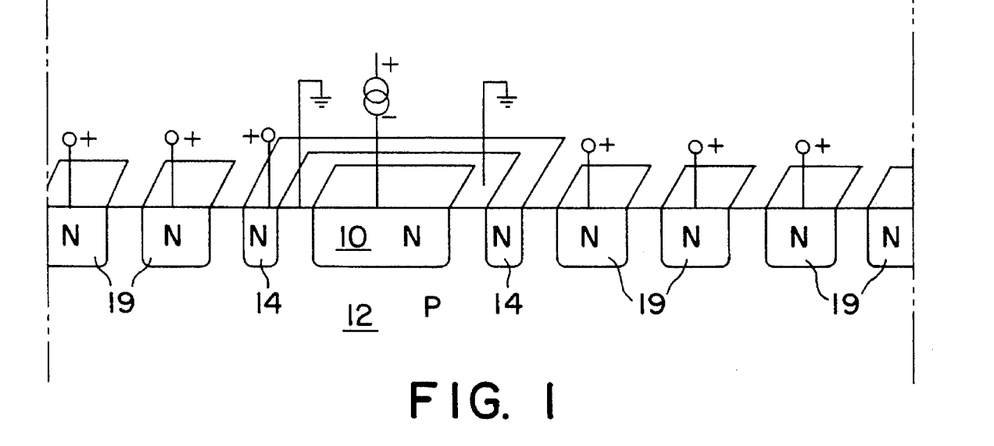
FIGS. 1, 2 and 3 show partially sectioned portions of three semiconductor integrated circuit chips in perspective view, wherein there are depicted prior art structures for protecting PN-junction isolated islands against collection of charge having, been injected into the substrate by a neighboring forward biased island.
Figure 2:
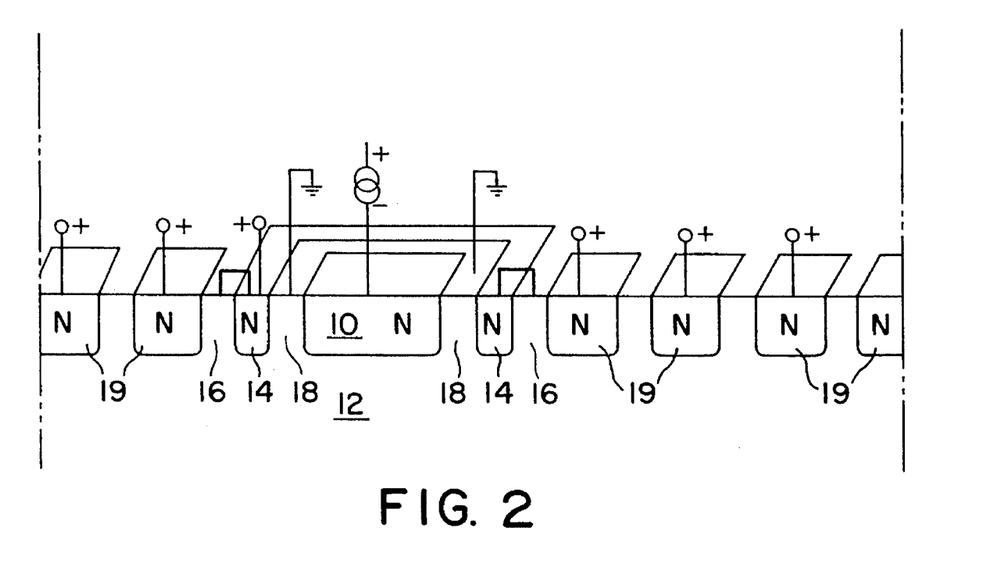
Figure 3:
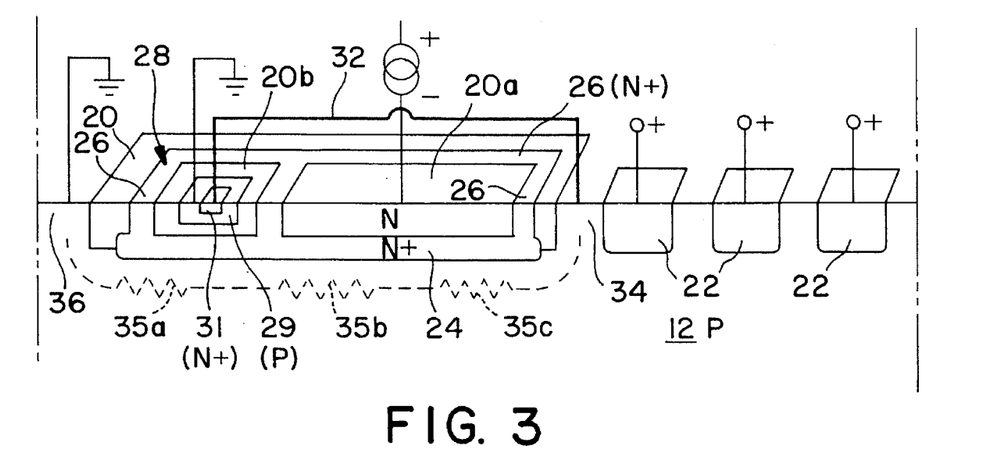

Three other such "defensive" structures are illustrated herein in FIGS. 1, 2 and 3. Both in FIGS. 1 and 2, the large island 10, or the island that is prone to become forward biased and inject electrons into the substrate 12, is intended to contain a power diode or transistor, and is surrounded by a spaced-away annular N-type ring or moat 14.

The protective N-type ring 14 in FIG. 1 is electrically connected to a positive bias voltage whereby the ring 14 serves as a preemptive collector of electrons, diverting them from surrounding islands 19.

In FIG. 2, the protective N-type ring 14 is simply connected electrically to the adjacent outer P-type isolation wall 16. Again the ring 14 serves to collect the injected electrons, but in this case they must flow through the ring 14, this current flowing again into the substrate 12 and out through the annular P-type isolation wall to the circuit ground point. Operation in this construction is based upon the premise that the radial flow of current in the substrate 12 generates a field that results in recombination of excess electrons which are thus prevented from reaching islands 19 adjacent to the large island. The field tends to confine the excess electrons to the portion of the substrate 12 under large island 10, and the recombination current must flow out through the grounded isolation wall 18 to ground.

The third "defensive" structure is illustrated herein in FIG. 3. The large epitaxial island 20 that is prone to become forward biased and inject electrons into the substrate 12, is intended to contain a power diode or transistor in the island portion 20a. The power device in island portion 20a is expected to cause island 20 to periodically forward bias the island-to-substrate PN-junction 20/12, at which time injected electrons tend to be collected by adjacent epitaxial N-type islands 22. A heavily doped N-type buried layer 24 is formed at the bottom of the island 20, which buried layer 24 contacts the system of heavily doped N-type walls 26 that delimit and mutually separate within the island 20 the island portions 20a and 20b.

A bipolar transistor 28 is formed in the island portion 20b to serve in a protective role for diverting injected carriers in the substrate 12 from reaching the adjacent islands 22. The P-type region 29 and the N-type region 31 serve respectively as the base and collector of the protective transistor 28 wherein the lightly doped N-type island portion 20b is the emitter. A conductor 32 connects the collector 31 of protective transistor 28 to the P-type isolation wall 34 which separates island 20 from islands 22. The isolation wall 36 at the opposite side of island 20 is connected to ground, i.e. the circuit point of lowest DC bias voltage.

The island portion 20b and protective transistor 28 are located to the left (as shown), away from the isolation wall 34 and the islands 22 to be protected. These relative positions and connections lead to a debiassing of the forward biased PN-junction 20/12 which causes a decrease in the collection of injected charge toward the adjacent islands 22. It is believed that in operation, this structure creates a current through protective transistor 28 that flows through conductor 32 and the substrate resistance 35, debiassing the PN-junction 12/20 most strongly at isolation wall 34 and progressively less strongly along the buried layer 24 and finally least strongly at isolation wall 36, so that injection is most pronounced an regions remote from the protected islands 22.

Figure 4:
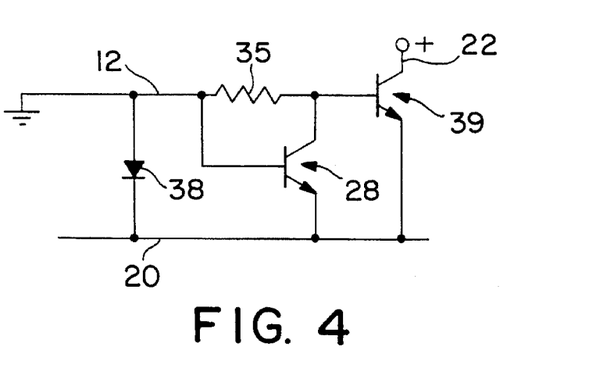
FIG. 4 shows a lumped equivalent circuit representing the prior art structure of FIG. 3.

In FIG. 4, the equivalent circuit of the structure of FIG. 3 is shown, wherein the PN-junction 20/12 is represented as a diode 38, the parasitic transistor 39 has a base corresponding to the P-type substrate 12, an emitter which is the N-type injecting island 20, and the collector(s) are the islands 22 to be protected. The resistor 35 (35a, 35b and 35c) represents the substrate resistance under the island 20 through which the debiassing current flows from isolation wall 34, through substrate 12 and conductor 32, to the collector of protective transistor 28.

It is an object of this invention to provide a new and improved means for protecting devices formed in PN-junction isolated islands from the collecting of current having been injected into the substrate by another and forward biased island.

SUMMARY

An integrated circuit chip is formed in a semiconductor substrate of one conductivity type, a first PN-junction isolated island of the opposite conductivity type is formed in and surrounded by the substrate. The term "substrate" as used herein is meant to include that part of the semiconductor body composed of contiguous regions of the one-type conductivity which include those having been more heavily doped than others, e.g. isolation wall regions between islands of opposite conductivity type.

This invention concerns the situation in which the first island may momentarily become forward biased with respect to the surrounding substrate, wherein at least a second PN-junction isolated island of the opposite conductivity type is formed in the substrate and lies to one side of the first island, such that the second island tends to collect injected carriers from the first momentarily forward-biased island.

The integrated circuit chip further includes a first PN-junction isolated island of the opposite conductivity type formed in and surrounded by the substrate. At least a second PN-junction isolated island of the opposite conductivity type is formed in the substrate and lies to one side of the first island, which second island tends to collect injected carriers from, the first momentarily forward-biased island.

A PN-junction isolated third island of the opposite conductivity type includes a vertical protective bipolar transistor, The protective transistor has a base of one conductivity type and has a collector and an emitter of the opposite conductivity type.

Circuit ground conductors connect a ground point in the integrated circuit to the protective-transistor base region and to an isolation-wall portion of the substrate at the opposite side of the first island.

One electrical conductor connects the protective-transistor emitter to an opposite-conductivity-type portion of the first island, and another electrical conductor connects the protective-transistor collector to an isolation-wall portion of the substrate at the one side of the first island.

It is preferred that, the third island be located adjacent to the one side of the first island, but another effective location for the third island is adjacent to yet another side of the first island, e.g. a lateral side joining the one side to the opposite side.

The protective-transistor base may be formed in a chip-surface portion of the third island, and the third-island emitter is an opposite-conductivity-type region having been formed in a chip-surface portion of the base.

However, a preferred protective transistor construction has a heavily doped opposite-conductivity-type buried layer formed in the third island abutting the one-conductivity-type substrate to serve as the protective-transistor collector. A one-conductivity-type buried layer then extends into the third island from the opposite-conductivity-type buried layer forming the protective-transistor base, and a heavily doped opposite-conductivity-type plug region extends through the third island from the surface of the chip to the opposite-conductivity-type buried layer. The another electrical conductor is connected to the third island by contacting the plug region.

This invention reduces the amount of current that is parasitically collected by the second islands by causing the injection to be preferential in one direction away from the second islands, and by providing a retarding field below the injecting first island to prevent injected charge from diffusing out towards the second islands.

In yet another preferred embodiment, a pair of such large alternately injecting transistors and their corresponding protective transistors as described above are incorporated in one integrated circuit chip, the two large transistors having lateral sides respectively adjacent to each other but spaced apart by a portion of the one-conductivity-type substrate. These two large islands contain power transistors may be expected to drive an inductive load and turn on alternately. In this ease the collectors of the pair of protective transistors are resistively connected via the substrate and the protective transistor associated with the large on-transistor tends to turn on in the inverse direction, i.e. what was the collector becomes the emitter of the protective transistor, and this results in a current between the two protective transistor collectors in a direction to reinforce the parasitic current from the injecting large island to the small islands.

In contract to the prior art protective transistors which have a high current gain in the inverse operating mode, the preferred protective transistors of this invention have a lower current gain in the reverse direction, and thus provide greater efficiency of protection in an integrated circuit chip having alternately injecting large transistors.

In the preferred embodiment, the protective structures of this invention wherein the separate protective transistor occupies a space between the PN-junction-isolated small to be protected and the injecting island, provides greater physical separation of injecting and protected islands leading to a further increase in protection efficiency while at the same time the whole structure occupies about the same area in the integrated circuit chip.

BRIEF DESCRIPTION OF THE DRAWINGS

The illustrations in FIGS. 1, 2, 3, 5 and 9 are all simplified and stylized for greater clarity and easier comparison.

DESCRIPTION OF THE PREFERRED EMBODIMENTS

Figure 5:
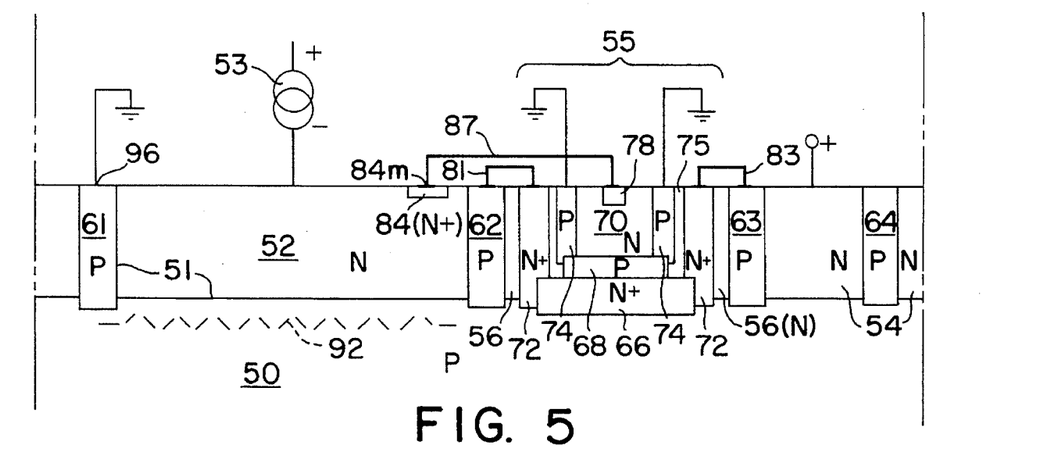
FIG. 5 shows in side sectional view a portion of one embodiment of a semiconductor integrated circuit chip of this invention having a separate injected-charge protective transistor.

The integrated circuit of FIG. 5 is formed in a P-type silicon substrate 50. A large N-type island 52 may contain a power device (not shown), such as a bipolar transistor, a field effect transistor (FET) or a diode. During certain moments in the operation of the power device, the N-type island 52 may become negative relative to the P-type substrate 50; the source of this negative voltage is represented by the generator 53. The momentary negative voltage applied to island 52 results in the forward biasing of the PN-junction between island 52 and substrate 50, causing injection of minority carriers (electrons) into the substrate 50.

To the right side (as shown) of the large island 52 are several relatively small N-type islands 54 that may contain small-signal-carrying devices (not shown). Small device islands 54 are connected to a positive voltage source to back bias and isolate each small island 54 with respect to the substrate 50 which is held at the most negative bias potential, or ground. A protective NPN transistor 55 is formed in an epitaxial island 56 at the right side (as shown) of the large island 52.

The above-described structure can be made by first forming a lightly doped M-type epitaxial layer in a P-type substrate 50, and subsequently selectively diffusing P-type impurities through the epitaxial layer 51 to form isolation walls 61, 62, 63 and 64. An N+ buried layer 66 and a P-type buried layer 68 are formed by well known steps before and during the growing of the epitaxial layer 51.

In island 56 of protective transistor 55, there is additionally formed the annular heavily doped N+ wall 72 to enclose by another selective diffusion, an epitaxial pocket 70. The annular N+ plug contacts the N+ buried layer 66 forming an inner region 75 of epitaxial material that is entirely surrounded by N+ regions 72 and 66. Within the epitaxial inner region 75, an annular P-type wall 74 reaches and contacts the P-type buried layer 68 forming an even smaller epitaxial pocket 70. The N+ emitter region 78 is formed at a central chip-surface portion of the pocket 70. Transistor 55 has a low current gain in both the forward and inverse operating directions.

The annular N+ plug 72 is electrically connected to the adjacent outer P-type isolation wall regions 62 and 63 via electrical conductors 81 and 83. The N-type injecting island 52 includes an N+ contact region 84 which is electrically connected to the emitter region 78 of the protective transistor 55 via electrical conductor 87. The P-type walls 74 in the protective transistor 55 are connected to the integrated circuit ground, or point of lowest bias voltage.

Figure 6:
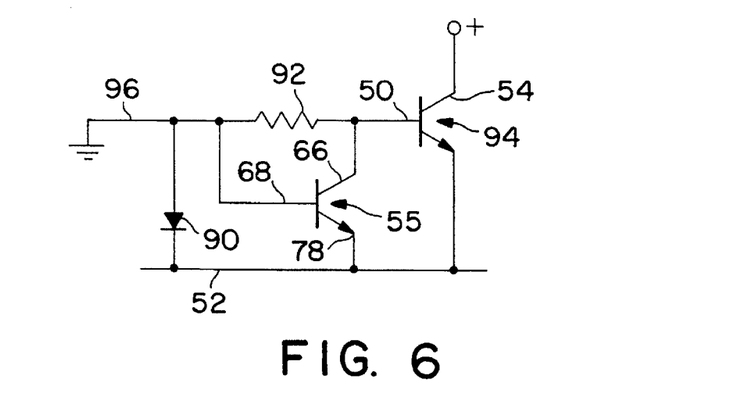
FIG. 6 shows a lumped equivalent circuit of the structure of FIG. 5.

In the lumped equivalent circuit of FIG. 6, diode 90 represents the PN-junction between the injecting island 52 and the substrate 50. The resistance of the substrate 50 that underlies the injecting island 52 is represented as discrete resistor 92. When the injecting island 52 is forward biased with respect to the circuit ground, charge injection will occur across the PN-junction 51 of island 52.

The position of the ground contact, at isolation wall region 61 will cause progressive debiasing of the junction 51 from left to right (as shown). In other words, the injected current flow through the resistive path in substrate 50, as represented by discrete resistor 92, causes a progressive increase in the forward biassing of the PN-junction 51 from right to left. This will cause the injected current to be greatest in the part of PN-junction 51 at isolation wall portion 61. Therefore injection is advantageously caused to be preferential in one direction, namely away from the reverse-biassed N-type islands 54 and toward the wall portion 61.

It is most readily seen by reference to the equivalent circuit of FIG. 6 that when island 52 goes negative and becomes forward biased with respect to the substrate 50, the emitter 78 of protective transistor 55 becomes negative with respect to the base 68 and transistor 55 turns on to shunt current away from the base-emitter junction of the parasitic transistor 94, thus disabling transistor 94.

The collector current from protective transistor 55 flows through the resistive substrate region under the injecting island 52, which region is portrayed here as lumped resistor 92 by which injected current reaches the low impedance circuit ground point 96 in isolation wall 61.

The protective transistor of this invention creates a retarding field to injected charge in the substrate under the injecting island, and in other ways also performs in a similar manner and with comparable efficiency to the protective structure described in the patent application by us that is entitled AN EPITAXIAL ISLAND WITH ADJACENT ASYMMETRICAL STRUCTURE TO REDUCE COLLECTION OF INJECTED CURRENT FROM THE ISLAND INTO OTHER ISLANDS, is assigned to the same assignee as is the present invention, and is filed simultaneously herewith. That patent application is being filed simultaneously herewith, and is hereby incorporated by reference herein for further elaborating the relationship between protective mechanisms and structural features of the protective devices.

Figure 7:
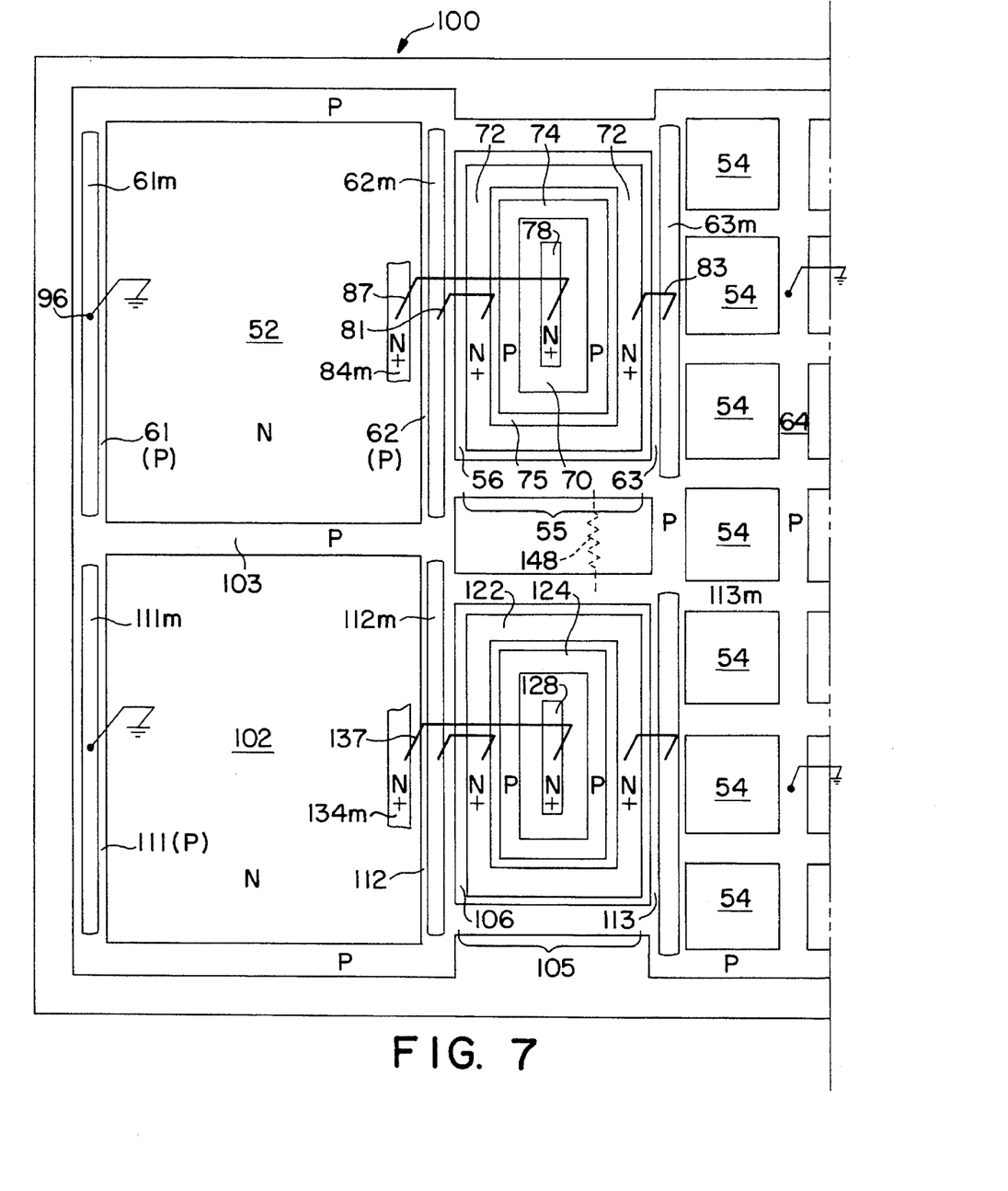
FIG. 7 shows in top view a portion of a semiconductor integrated circuit chip of this invention, including the structural features of those shown in FIG. 5, plus additional features. The elements in FIG. 7 have the same identifying numerals as do corresponding elements of FIG. 5.

In the plan view of FIG. 7, a semiconductor integrated circuit chip 100 includes in the top half (as shown) the same features portrayed in FIG. 5, each being designated in FIG. 7 by the corresponding numerals of FIG. 5.

In the lower half of FIG. 7, elements that mirror and thus correspond to those in the top half of this figure are designated by the corresponding numerals plus 50, e.g. the upper large island is 52 and the lower large island is 102.

Over the P-type isolation wall portions 61, 62 and 63 there are shown in FIG. 7, electrically contacting metal strips 61m, 62m and 63m respectively. The conductors 81, 83 and 87, most conveniently shown here as a wire are in practice more conveniently implemented as conventional selectively deposited metal strips. The lower large island 102, that may also include a power transistor (not shown) in a central region thereof, is positioned with an upper lateral side adjacent to and spaced by a P-type isolation-wall portion 103 from the lower lateral side of large island 52. A protective N-type island 105 lies adjacent to, and is spaced by, P-type isolation-wall portion 112 from, the large island 102. Island 102 is connected by conductor 137 to the collector 128. The large power-transistor injecting islands 52 and 102 are positioned side by side as is usual practice for physically spacing the power devices away from the small device islands 54 as far as practicable.

In order to clearly show the relationships of the elements in FIGS. 5 and 7, the protective transistors 55 and 105 are shown much larger than would be necessary relative to the sizes of the large islands 52 and 102. In practice, the protective transistors 55 and 105 will appear to be long but narrow devices positioned between the injecting large islands and the small islands 54 to be protected.

Two such large islands, as islands 52 and 102 of FIG. 7, are often built into one integrated circuit chip, each containing a power transistor. Such pairs of power transistors are required in totem pole driver circuits and more specifically bridge drivers in which the two power transistors drive an inductive load such that the N-type islands in which the power transistors are formed become alternately driven negative with respect to the surrounding substrate. Examples of such driver circuits are described in the patent U.S. Pat. No. 5,075,568 to A. Bilotti et al that is assigned to the same assignee as is the present invention.

Figure 8:
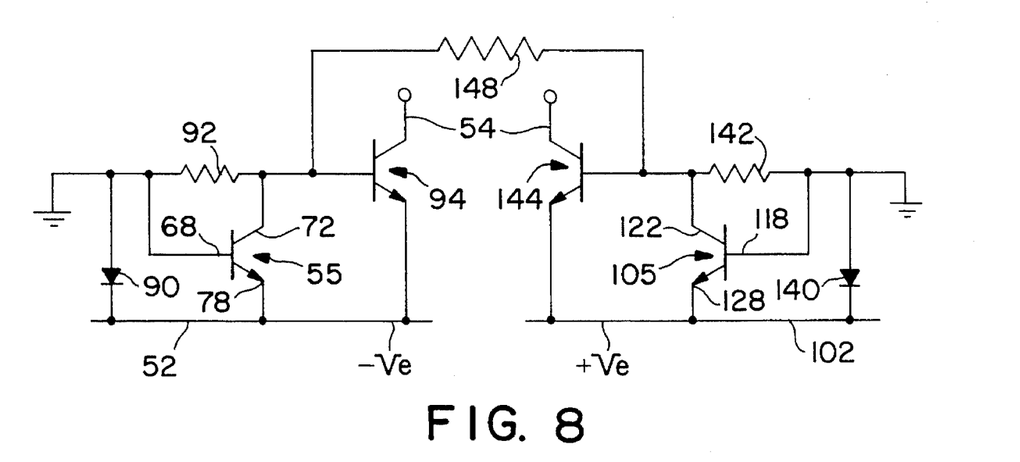
FIG. 8 shows a lumped equivalent circuit of the structure of FIG. 7.

The two mutually adjacent islands 56 and 106 are connected by the substrate resistance depicted in FIGS. 7 and 8 as lumped resistor 148.

In equivalent circuit of FIG. 8, the PN-junction between the large island 52 and the substrate 50 is represented by diode 90. The substrate resistances beneath large islands 52 and 102 are respectively represented by resistors 92 and 142. The parasitic protective transistors associated with large islands 52 and 102 are respectively 55 and 105.

When one of the two large islands, cog. 52, is momentarily forward biased with respect to the substrate 50, the voltage of the substrate 50 nearby the buried layer 66 of the active protective transistor 55 would drop the collector voltage of the protective-transistor 55 to a negative value. Since the N+ plug 72, namely the collector of active transistor 55, is connected to the N+ plug 122, namely the collector 122 of "inactive" protective transistor 105, via the substrate resistance 148, the collectors 72 and 122 may both be drawn down to a negative voltage. This would cause the protective transistor 105 to turn on in inverse mode, because the junction from collector 116 to base 118 of protective transistor 105 is now forward biased.

This in turn causes substrate current to flow between the two collectors 72 and 122 and inversely through protective transistor 105 to the positive bias voltage +Ve of large island 102, leading to a substantial reduction in the effectiveness of the protective transistor 55 for diverting injected current from the large injecting island 52 to the adjacent large island 102, In the prior art structure of FIG. 3. the protective transistor 28 has a low current gain in the forward (active protection) direction and a high current gain in the inverse direction, exacerbating the above-described deterioration in the efficiency of the protective transistor of the prior art type 28 when used in pairs to serve in conjunction with two alternately injecting large islands.

On the other hand, the preferred protective transistors 55 and 105, just described herein, have a relatively low gain in both directions. Thus the inherent efficiency of protection provided in the structure of FIG. 5 wherein protection is provided for one power transistor only, is about the same as for the prior art structure of FIG. 3.

However, for use in pairs as shown in FIG. 7, the protective transistors 55 and 105 are advantageously, poorly cross coupled owing to the low inverse current gains of these protective transistors, which leads to lower parasitic currents between them (via substrate resistance 148), and leads to lower power dissipation.

However the bipolar protective transistor of this invention may be constructed, the greater intervening space occupied by the protective island between the injecting large island and the small islands 54 to be protected as shown in FIG. 7, tends to provide additional efficacy of protection, and this intervening location of the protective transistor is preferred.

Figure 9:
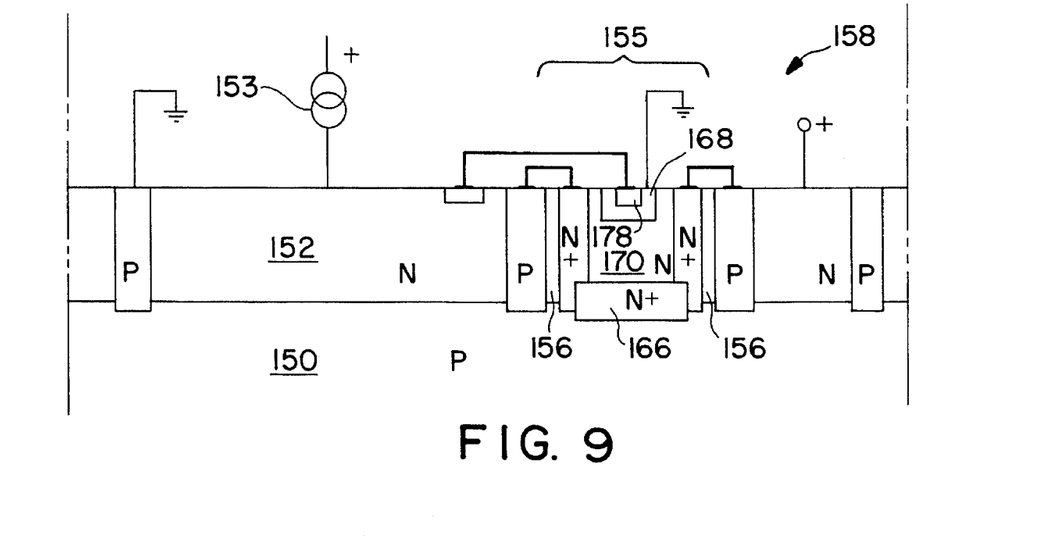
FIG. 9 shows in side sectional view, an alternate protective-transistor structure in a semiconductor integrated circuit chip of this invention.

The integrated circuit of FIG. 9 is formed in a P-type silicon substrate 150. During certain moments in the operation of the power device, the N-type island 152 may become negative relative to the P-type substrate 150; the source of this negative voltage is represented by the generator 153. The momentary negative voltage applied to island 152 results in the forward biasing of the PN-junction between island 152 and substrate 150, causing injection of minority carriers (electrons) into the substrate 150.

To the right side (as shown) of the large island 152 are several relatively small N-type islands 154 that may contain small-signal-carrying devices (not shown). A protective NPN transistor 155 is formed in an epitaxial island 156 at the right side (as shown) of the large island 152.

Transistor 155 has a base 168 diffused through the surface of the semiconductor chip 158 into the N-type island 156, and an emitter 178 formed in the island 156. An annular N+ plug extends through the epitaxial island 156 to contact the N+ buried layer 166 and forms a central N-type epitaxial pocket portion 170 that serves along with the buried layer 166 as the collector of protective transistor 155. The numerals identifying the elements in FIG. 9 are each 100 plus the numeral that identifies a corresponding element in FIG. 5.

In this more conventionally constructed vertical protective transistor 155 the current gains in forward and reverse conduction directions are advantageously high and low, respectively, whereas, quite the opposite relationship is found in the prior art protective transistor 28 of FIG. 3, so this protective transistor 155 also performs well in pairs for use with two large injecting islands.

It is preferred to locate the protective transistor between the large injecting transistor and the islands to be protected, e.g. as is shown in FIG. 7. However, other locations may also have advantages. For any of the chosen locations of the protective transistors the grounded isolation-wall portion of the substrate and the isolation-wall portion of the substrate to which the collector of the protective transistor is electrically connected must be on opposing sides of the injecting transistor.

Figure 10:
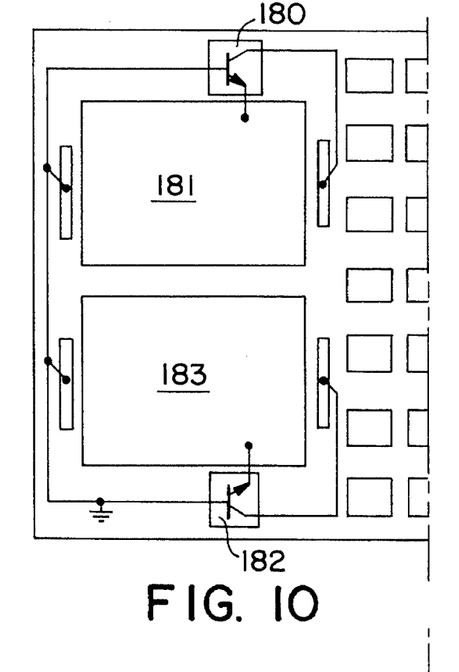
FIG. 10 shows in plan view a portion of an integrated circuit chip of this invention showing alternate positions of the protecting transistors.
Figure 11:
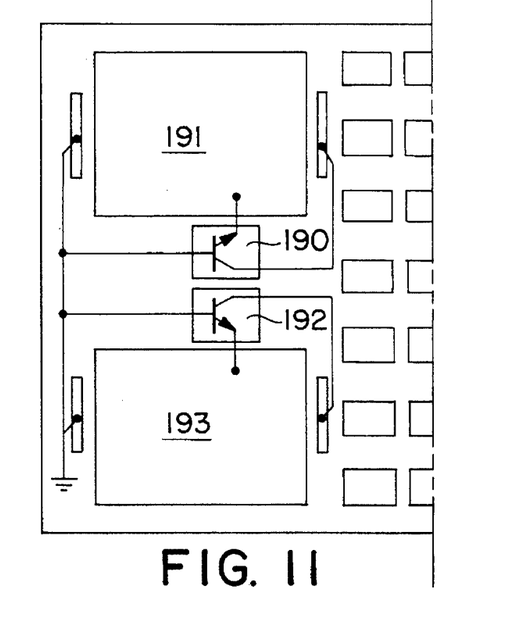
FIG. 11 shows in plan view a portion of another integrated circuit chip of this invention showing alternate positions of the protecting transistors.

Alternate positions for protective transistors 180 and 182 are shown symbolically in FIG. 10, naively at the mutually-opposing lateral sides of the associated side-by-side large injecting transistor islands 181 and 183, respectively. In FIG. 11 protective transistors 190 and 192 are shown at the mutually-facing lateral sides of the associated side-by-side large injecting transistor islands 191 and 193, respectively. An advantage of the opposing lateral side locations of protective transistors 180 and 182, shown in FIG. 10, is that the protective transistors 180 and 182 may be interposed between contact pads (not shown) that may also be located along these opposing 8ides of the large transistors and so would permit a layout that is particularly space efficient.

Figure 12:
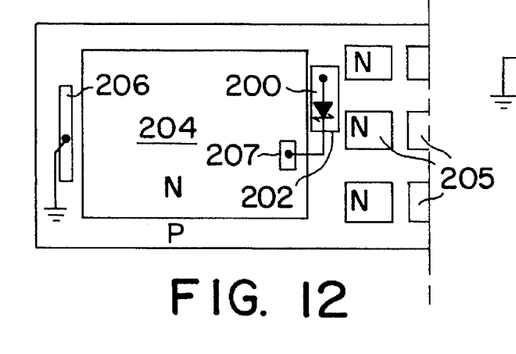
FIG. 12 shows in plan view a portion of an integrated circuit of this invention employing a protective Shottky diode.

Referring to FIG. 12, the anode of the protective Schottky diode 200 is formed in a surface of the isolation-wall portion of the substrate 202 that is located between the large injecting island 204 and a group of small islands 205 that are to be protected. The cathode of the Schottky diode 200 is electrically connected to a metal strip 207 contacting a portion of the large island 204. On the opposite side of the large island 204, a metal contact strip 206 contacts an isolation-wall portion of the substrate which is electrically connected to a circuit ground point of the integrated circuit.

Figure 13:
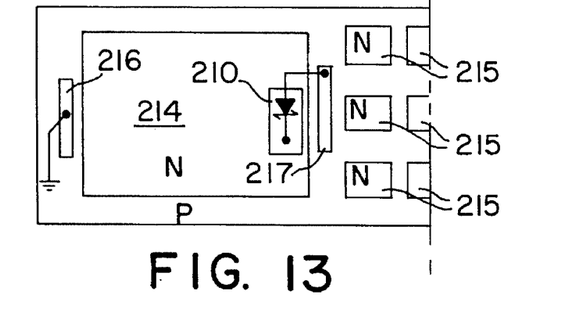
FIG. 13 shows in plan view a portion of another integrated circuit of this invention employing a protective Shottky diode.

In FIG. 13, a similar integrated circuit has a protective schottky diode 210 is formed in a surface portion of the large island 214. The anode of the Schottky diode 210 is electrically connected to a metal strip 217 contacting an isolation-wall portion of the substrate lying between the large island 214 and the small islands 215 to be protected. On the side of the large island 214, which side is opposite the small islands 215 to be protected, a metal contact strip 216 contacts an opposite isolation-wall portion of the substrate which is electrically connected to a circuit ground point of the integrated circuit.

Figure 14:
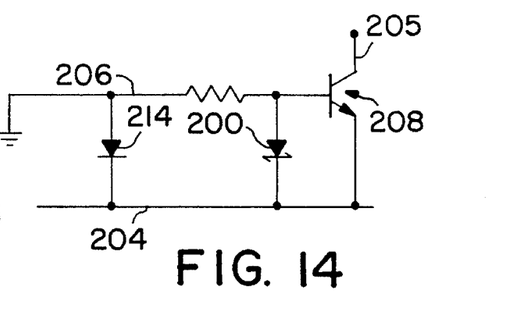
FIG. 14 shows an equivalent circuit diagram for the integrated circuit of FIG. 12.

In FIG. 14, the equivalent circuit of the structure illustrated in FIG. 10 shows that the Schottky diode 200 shunts the base-emitter junction of the parasitic transistor 208 which is formed by formed by the large island 104 and small islands 205. The Schottky diode holds that junction to a lower voltage than that needed to forward bias the base-emitter junction and turn on the parasitic transistor 208. Thus there is created as for the integrated circuits with protective transistors described above, a voltage gradient under the large transistor in a direction to draw the injected charge toward (leftward as shown) the grounded isolation wall at the opposite side of the large island 204.

The equivalent circuit for the embodiment shown in FIG. 13 is essentially identical to that shown in FIG. 14. Therefore, the efficiency of protection provided is not as dynamic or as great as for the embodiments shown above having a protective transistor. But, the integrated circuits of FIGS. 12 and 13 using protective Schottky diodes are more efficient in terms of integrated area required, and in certain situations, e.g. wherein a small amount of injected current collection by the small islands is tolerable, then these simple protective Schottky structures may be preferred. A further advantage is that for the case where there are two potentially injecting islands and two protecting Shottky diodes, the afore-mentioned cross-conduction effect is zero because there is no inverse conduction of the protecting Shottky diode, like there was with the protective transistors 55 and 105.

We claim:

1. An integrated circuit chip of the type having a semiconductor substrate of one conductivity type, a first PN-junction isolated island of the opposite conductivity type formed in and surrounded by said substrate, which first island may momentarily become forward biased with respect to said surrounding substrate, at least a second PN-junction isolated island of said opposite conductivity type formed in said substrate and lying to one side of said first island, which second island tends to collect injected carriers from said first momentarily forward-biased island, wherein the improvement comprises:

a) a PN-junction isolated third island of the opposite conductivity type, a vertical protective bipolar transistor formed in said third island, said protective transistor having a base of one conductivity type and having a collector and an emitter of the opposite conductivity type;

b) circuit ground conductors connecting a ground point in said integrated circuit to said protective-transistor base region and to an isolation-wall portion of said substrate at a side opposite that of said one side of said first island;

c) one electrical conductor connecting said protective-transistor emitter to an opposite-conductivity-type portion of said first island; and d) another electrical conductor connecting said protective-transistor collector to an isolation-wall portion of said substrate at said one side of said first island.

2. The integrated circuit chip of claim 1 wherein said third island is located adjacent to said one side of said first island.

3. The integrated circuit chip of claim 1 wherein said third island is located adjacent to yet another side of said first island.

4. The integrated circuit chip of claim 1 wherein a heavily doped opposite-conductivity-type buried layer formed in said third island abutting said one-conductivity-type substrate serves as said protective-transistor collector, a one-conductivity-type buried layer extends into said third island from said opposite-conductivity-type buried layer forming said protective-transistor base, and a heavily doped opposite-conductivity-type plug region extends through said third island from the surface of said chip to said opposite-conductivity-type buried layer, said another electrical conductor being connected to said third island by contacting said plug region.

5. The integrated circuit chip of claim 4 wherein said opposite-conductivity-type plug region is an annular wall region enclosing an inner portion of said opposite-conductivity-type third island; and said chip additionally comprising in said third island a one-conductivity-type annular wall region formed in said inner portion and extending from said chip surface to said buried one-conductivity-type base region, said ground conductor being connected to said protective-transistor base region by contacting said one-conductivity-type annular wall region; and a heavily doped opposite-conductivity-type contact region being formed at said chip surface in the central portion of said third island that is enclosed by said one-conductivity-type annular wail region; said contact region serving as said protective-transistor emitter to which said one electrical conductor is connected.

6. The integrated circuit chip of claim 1 wherein a one-conductivity-type region formed in said third island at the chip surface serves as said protective transistor base, and an opposite-conductivity-type region formed in said base region serves as said protective transistor emitter.

7. An integrated circuit of the type having a semiconductor substrate of one conductivity type, two large PN-junction isolated islands of the opposite conductivity type which large PN-junction isolated islands may alternately become forward biased with respect to said substrate, each of said two large islands being each formed in and surrounded by said substrate, each of said two large islands having one side, an opposite side to said one side, a first lateral side, and an opposing second lateral side; said large islands positioned with said first lateral sides facing each other, a group of small PN-junction isolated islands of the opposite conductivity type formed in said substrate and lying adjacent to said one sides of said first and second large islands, wherein the improvement comprises:

a) two separate PN-junction isolated islands of the opposite conductivity type formed respectively adjacent said two large islands, a protective vertical bipolar transistor formed respectively in each of said two separate islands, each of said protective transistors having a base of one conductivity type and having a collector and an emitter of the opposite conductivity type;

b) circuit ground conductors connecting a ground point in said integrated circuit to each of said protective-transistor base regions and to two isolation-wall portions of said substrate lying respectively at said opposite sides of said large islands;

c) one pair of electrical conductors connecting respectively said protective-transistor emitters to an opposite-conductivity-type portion of said large islands, respectively; and d) another pair of electrical conductors connecting respectively said protective-transistor collectors to an isolation-wall portion of said substrate at said one side respectively of said two large islands.

8. The integrated circuit of claim 7 wherein said separate islands containing said protective transistors are located in two regions respectively between said one large island and said group of small islands and between said other large island and said group of small islands.

9. The integrated circuit of claim 7 wherein said separate islands containing said protective transistors are located in a region between said two large islands.

10. The integrated circuit of claim 7 wherein said two large islands, said two corresponding separate protective islands being located respectively adjacent to said two opposing lateral sides.

* * * * *